(12) United States Patent
Jones et al.

(10) Patent No.: US 11,573,450 B1
(45) Date of Patent: Feb. 7, 2023

(54) ELECTRONIC DEVICES WITH CHEMICALLY STRENGTHENED COHERENT FIBER BUNDLES

(71) Applicant: Apple Inc., Cupertino, CA (US)

(72) Inventors: Christopher D. Jones, Los Gatos, CA (US); Dale N. Memering, New York, NY (US); Daniel J. Barrett, Redwood City, CA (US); Erik G. de Jong, San Francisco, CA (US); Sameer Pandya, Sunnyvale, CA (US); Tyler A. Marshall, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/408,294

(22) Filed: Aug. 20, 2021

Related U.S. Application Data

(60) Provisional application No. 63/082,289, filed on Sep. 23, 2020.

(51) Int. Cl.
| | |
|---|---|
| *G02F 1/1335* | (2006.01) |
| *G02B 6/08* | (2006.01) |
| *F21V 8/00* | (2006.01) |
| *G02F 1/1333* | (2006.01) |
| *G02B 6/02* | (2006.01) |
| *G06F 1/16* | (2006.01) |

(52) U.S. Cl.
CPC ..... *G02F 1/133524* (2013.01); *G02B 6/0078* (2013.01); *G02B 6/08* (2013.01); *G02F 1/13336* (2013.01); *G02B 6/02395* (2013.01); *G06F 1/163* (2013.01)

(58) Field of Classification Search
None
See application file for complete search history.

(56) References Cited

U.S. PATENT DOCUMENTS

| | | | |
|---|---|---|---|
| 7,169,470 B2 * | 1/2007 | Wolff | C03C 3/062 428/375 |
| 7,824,770 B2 | 11/2010 | Honma et al. | |
| 8,780,015 B2 * | 7/2014 | Watanabe | G02F 1/13336 345/1.3 |
| 9,025,111 B2 * | 5/2015 | Teller | G09G 5/00 349/1 |
| 9,274,369 B1 * | 3/2016 | Lee | G02B 6/0005 |

(Continued)

*Primary Examiner* — Jerry Rahll
(74) *Attorney, Agent, or Firm* — Treyz Law Group, P.C.; G. Victor Treyz; Tianyi He

(57) ABSTRACT

An electronic device may have a display and other optical components such as optical sensors. The display and other components may be overlapped by chemically strengthened glass coherent fiber bundles. The surfaces of a coherent fiber bundle may include ion-exchanged glass that places theses surfaces under compressive stress. In some configurations, the coherent fiber bundle is symmetrically stressed and has equal amounts of compressive stress on opposing surfaces. In other configurations, the coherent fiber bundle is asymmetrically stressed and has more compressive stress on one surface than the other. The coherent fiber bundle may have areas with curved cross-sectional profiles, planar areas, and/or areas with compound curvature. Sensor windows may be formed in the coherent fiber bundle that are surrounded by an opaque area. When overlapping a display, the coherent fiber bundle may serve as a display cover glass layer.

20 Claims, 11 Drawing Sheets

(56) References Cited

U.S. PATENT DOCUMENTS

| | | | |
|---|---|---|---|
| 9,435,939 B2* | 9/2016 | Yang | G02F 1/3137 |
| 9,477,112 B2* | 10/2016 | Wu | G02B 6/0051 |
| 9,688,536 B2 | 6/2017 | Zhang et al. | |
| 10,143,094 B2* | 11/2018 | Chin | G02B 6/06 |
| 10,223,952 B2 | 3/2019 | Powell et al. | |
| 10,564,914 B2* | 2/2020 | Chin | G02F 1/1343 |
| 10,579,157 B1* | 3/2020 | Wilson | H01H 13/83 |
| 10,620,365 B2* | 4/2020 | Dawson | G02B 6/008 |
| 10,860,142 B1* | 12/2020 | Northcott | G02B 6/04 |
| 11,092,835 B2* | 8/2021 | Asamizu | G02F 1/13336 |
| 11,131,803 B2* | 9/2021 | Yang | G02B 6/0078 |
| 11,150,401 B2* | 10/2021 | Zang | G02B 6/06 |
| 11,215,752 B1* | 1/2022 | Lin | G02B 6/08 |
| 11,216,236 B2* | 1/2022 | Oh | G02B 6/1223 |
| 11,231,814 B1* | 1/2022 | Wittenberg | G02B 6/06 |
| 11,247,421 B1* | 2/2022 | Gulgunje | B29D 11/00663 |
| 2003/0012532 A1* | 1/2003 | Prigent | H04M 1/0266 362/554 |
| 2004/0220038 A1* | 11/2004 | Wolff | C03C 3/062 501/64 |
| 2005/0243415 A1 | 11/2005 | Lowe et al. | |
| 2011/0025594 A1* | 2/2011 | Watanabe | G02F 1/13336 345/87 |
| 2011/0255301 A1* | 10/2011 | Watanabe | G02F 1/13336 362/558 |
| 2013/0278872 A1* | 10/2013 | Teller | G06F 3/1446 349/96 |
| 2014/0016071 A1* | 1/2014 | Yang | G02B 6/0005 362/19 |
| 2014/0037257 A1* | 2/2014 | Yang | G02B 6/0078 385/116 |
| 2014/0210770 A1 | 7/2014 | Chen et al. | |
| 2014/0218961 A1* | 8/2014 | Wu | G02B 6/0008 362/559 |
| 2015/0092395 A1* | 4/2015 | Wu | G02B 6/0061 385/129 |
| 2017/0094815 A1* | 3/2017 | Chin | G02B 6/02052 |
| 2018/0128973 A1 | 5/2018 | Powell et al. | |
| 2019/0383983 A1* | 12/2019 | Dawson | G09F 9/3026 |
| 2019/0391326 A1* | 12/2019 | Yang | G02B 6/08 |
| 2020/0218007 A1* | 7/2020 | Zang | G02B 6/06 |
| 2020/0301184 A1* | 9/2020 | Asamizu | G02B 6/0061 |

* cited by examiner

ELECTRONIC DEVICES WITH CHEMICALLY STRENGTHENED COHERENT FIBER BUNDLES

This application claims the benefit of U.S. provisional patent application No. 63/082,289, filed Sep. 23, 2020, which is hereby incorporated by reference herein in its entirety.

FIELD

This relates generally to electronic devices, and, more particularly, to coherent fiber bundles for electronic devices with displays.

BACKGROUND

Electronic devices may have displays. Displays have arrays of pixels for displaying images for a user. To protect sensitive display structures from damage, displays may be provided with display cover layers.

SUMMARY

An electronic device may have a display and other optical components such as optical sensors. The display and/or other components may be overlapped by a chemically strengthened glass coherent fiber bundle.

During operation of the display, an image from the display may be transported from an input surface of the coherent fiber bundle to an output surface. The output surface may form part of the outermost surface of the electronic device.

Optical sensors such as health sensors may operate through a portion of a coherent fiber bundle on a rear device surface or other surface. Sensor windows in the coherent fiber bundle may be aligned with the optical sensors. The windows may be surrounded by an opaque portion of the coherent fiber bundle.

The coherent fiber bundle may have surfaces that are chemically strengthened. For example, the surfaces of the coherent fiber bundle may include ion-exchanged glass that places theses surfaces under compressive stress. The ion-exchanged glass may be formed from fiber cores, fiber cladding, or other coherent fiber bundle structures.

In some configurations, a coherent fiber bundle may be symmetrically stressed and may have equal amounts of compressive stress on opposing surfaces. In other configurations, the coherent fiber bundle may be asymmetrically stressed and may have more compressive stress on one surface than the other. This may create a curved-cross-sectional profile for the coherent fiber bundle.

The coherent fiber bundle may have areas with curved cross-sectional profiles, planar areas, and/or areas with compound curvature.

DETAILED DESCRIPTION

An electronic device may have a display. The display may have an array of pixels for creating an image. The image may be visible through transparent structures that overlap the array of pixels. These structures may include an image transport layer formed from a coherent fiber bundle.

A coherent fiber bundle may be included in an electronic device to help minimize display borders or to otherwise create a desired appearance for a display. The coherent fiber bundle may have an input surface that receives an image from an array of pixels and a corresponding output surface to which the image is transported from the input surface. A user viewing the electronic device will view the image from the array of pixels as being located on the output surface.

In configurations in which the input and output surfaces of an image transport layer such as a coherent fiber bundle have different shapes, the image transport layer may be used to warp the image produced by the array of pixels. For example, the shape of the image can be transformed and the effective size of the image can be changed as the image passes through the image transport layer. In some configurations, edge portions of the image can be stretched outwardly to help minimize display borders. If desired, image transport layer material may overlap optical sensors and other optical components.

Figure 1:
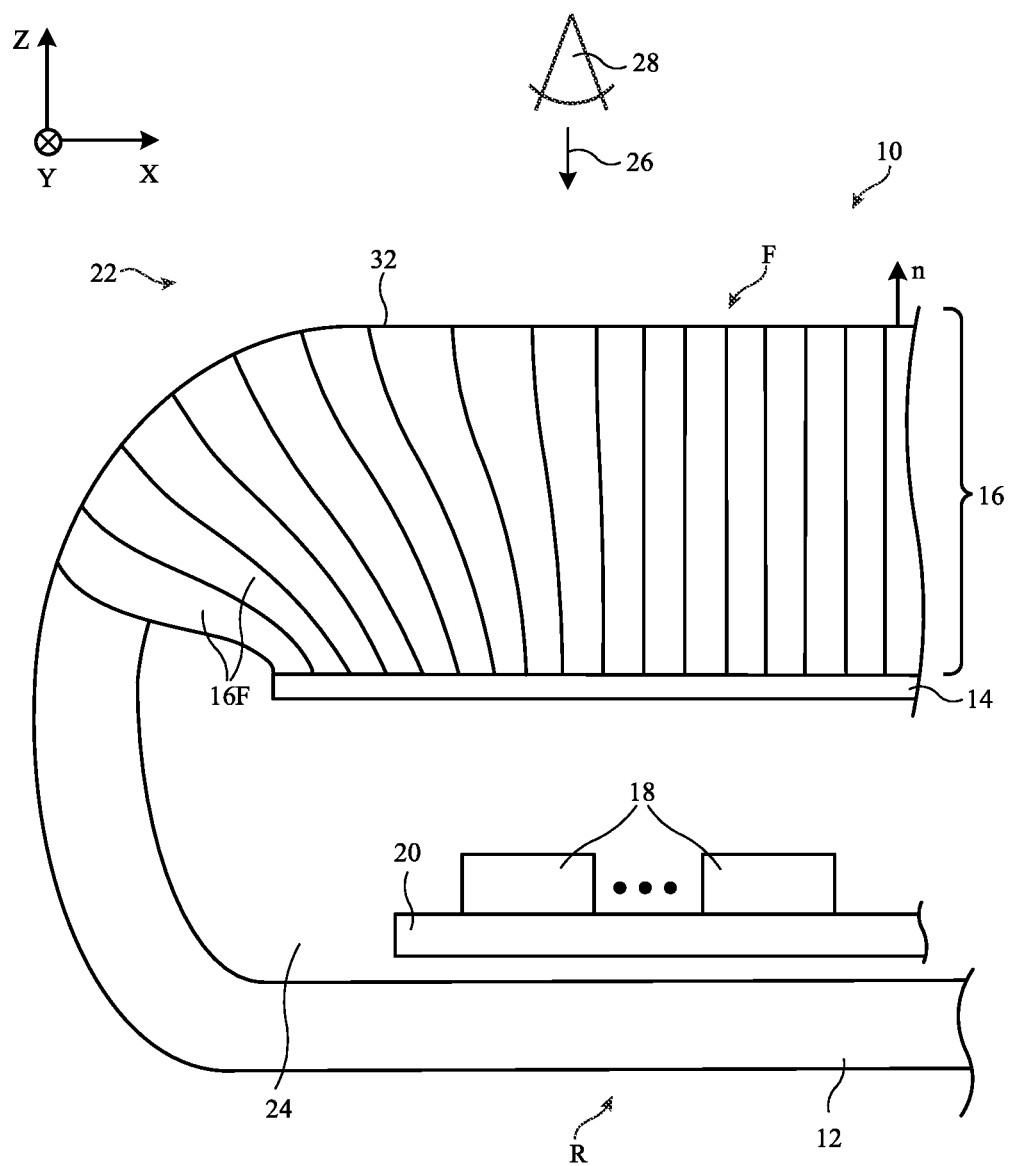
FIG. 1 is a cross-sectional side view of an illustrative electronic device with an image transport layer formed from a coherent fiber bundle in accordance with an embodiment.

A cross-sectional side view of a portion of an illustrative electronic device having a display that is overlapped by an image transport layer is shown in FIG. 1. In the example of FIG. 1, device 10 is a portable device such as a cellular telephone, wristwatch, or tablet computer. In general, any type of electronic device may have an image transport layer such as a desktop computer, a voice-control speaker, a television or other non-portable display, a head-mounted device, an embedded system such as a system built into a vehicle or home, an electronic device accessory, and/or other electronic equipment.

Device 10 includes a housing such as housing 12. Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose one or more interior regions such as interior region 24 and may separate interior region 24 from exterior region 22. For example, housing 12 may have a rear housing wall on rear face R and this rear housing wall may separate interior region 24 from exterior region 22. In some configurations, an opening may be formed in housing 12 for a data port, a power port, to accommodate audio components, or to accommodate other devices. Clear housing regions may be used to form optical component windows. Dielectric housing structures may be used to form radio-transparent areas for antennas and wireless power components.

Electrical components 18 may be mounted in interior region 24. Electrical components 18 may include integrated circuits, discrete components, light-emitting components and other optical components, optical sensors and other sensors, and/or other circuits and may, if desired, be interconnected using signal paths in one or more printed circuits such as printed circuit 20. If desired, one or more portions of the housing walls may be transparent (e.g., so that light associated with an image on a display or other light-emitting or light-detecting component can pass between interior region 24 and exterior region 22). In general, some or all of housing 12 on front face F of device 10, on the sidewalls of device 10, and/or on rear face R of device 10 may include transparent structures formed from image transport layer material, clear glass or polymer, and/or other clear material.

Electrical components 18 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use sensors and other input-output circuitry to gather input and to provide output and/or to transmit signals to external equipment. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 18.

Input-output circuitry in components 18 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using light-emitting diodes (e.g., crystalline semiconductor light-emitting diodes for status indicators and/or displays, organic light-emitting diodes in displays and other components), lasers, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 18) may include sensors. Sensors for device 10 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, optical touch sensors, optical proximity sensors, and/or other touch sensors and/or proximity sensors, monochromatic and color ambient light sensors, image sensors, fingerprint sensors, ultrasonic sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 18 may include mechanical devices for gathering input (e.g., buttons, joysticks, scrolling wheels, key pads with movable keys, keyboards with movable keys, and other devices for gathering user input). During operation, device 10 may use sensors and/or other input-output devices in components 18 to gather user input (e.g., buttons may be used to gather button press input, touch and/or force sensors overlapping displays can be used for gathering user touch screen input and/or force input, touch pads and/or force sensors may be used in gathering touch and/or force input, microphones may be used for gathering audio input, etc.). The control circuitry of device 10 can then take action based on this gathered information (e.g., by transmitting the information over a wired or wireless path to external equipment, by supplying a user with output using a haptic output device, visual output device, an audio component, or other input-output device in housing 12, etc.).

If desired, electronic device 10 (e.g., components 18) may include a battery or other energy storage device, connector ports for supporting wired communications with ancillary equipment and for receiving wired power, and other circuitry. In some configurations, device 10 may serve as an accessory and/or may include a wired and/or wireless accessory (e.g., a keyboard, computer mouse, remote control, trackpad, etc.).

Device 10 may include one or more displays such as display 14. The displays may, for example, include an organic light-emitting diode display, a liquid crystal display, a display having an array of pixels formed from respective light-emitting diodes (e.g., a pixel array having pixels with light-emitting diodes formed from respective crystalline light-emitting diode dies such as micro-light-emitting diode dies), and/or other displays. The displays may include rigid display structures and/or may be flexible displays. For example, a light-emitting diode display may have a polymer substrate that is sufficiently flexible to be bent. Display 14 may have a rectangular pixel array or a pixel array of another shape for displaying images for a user and may therefore sometimes be referred to as a pixel array. Display 14 may also sometimes be referred to as a display panel, display layer, or pixel layer. Each pixel array in device 10 may be mounted under a transparent housing structure (sometimes referred to as a transparent display cover layer, protective cover layer structures, etc.).

In the example of FIG. 1, display (pixel array) 14 is mounted under a protective layer such as layer 32. Layer 32, which may be considered to form a portion of the housing of device 10, covers front face F of device 10. Configurations may also be used in which opposing rear face R of device 10 and/or sidewall portions of device 10 have structures such as layer 32. These structures may cover displays, optical sensors, and other optical components.

As shown in FIG. 1, layer 32 may include image transport layer 16. In some configurations, a separate layer of glass, clear polymer, crystalline material such as sapphire or other crystalline material, and/or other transparent material may cover image transport layer 16 to help protect layer 16. Configurations in which image transport layer 16 is chemically strengthened and is sufficiently strong to serve as a protective layer without any additional layers are described herein as an example. When covering display 14 as shown in FIG. 1, for example, image transport layer 16 may serve as a display cover layer for display 14. In this arrangement, the outermost surface of image transport layer 16 forms part of the outermost surface of device 10. If desired, the outermost surface of image transport layer 16 may be coated with a thin-film protective coating (e.g., an oleophobic layer to help prevent smudges from fingerprints, etc.).

During operation, the pixels of display 14 produce image light that passes through image transport layer 16 (sometimes referred to as an image transfer layer). Optical fibers 16F may form a coherent fiber bundle for image transport layer 16. The fibers or other optical structures of image transport layer structures such as image transport layer 16 transport (transfer) light (e.g., image light and/or other light) from one surface (e.g., an input surface of layer 16 that faces display 14) to another (e.g., an output surface of layer 16 that faces viewer 28, who is viewing device 10 in direction 26). As the image presented to the input surface of layer 16 is transported to the output surface of layer 16, the integrity of the image light is preserved. This allows an image produced by an array of pixels to be transferred from an input surface of a first shape at a first location to an output surface with a different shape (e.g., a shape with a footprint that differs from that of the input surface, a shape with a curved cross-sectional profile, a shape with a region of compound curvature, and/or a shape with other desired features).

Image transport layer 16 may therefore move the location of an image and may optionally change the shape of the surface on which the image is presented. In effect, viewer 28 will view the image from display 14 as if the image were generated on the output surface of image transport layer 16. In arrangements in which the image from display 14 is warped (geometrically distorted) by image transport layer 16, digital pre-distortion techniques or other compensation techniques may be used to ensure that the final image viewed on the output surface of image transport layer 16 has a desired appearance. For example, the image on display 14 may be prewarped so that this prewarped image is warped by an equal and opposite amount upon passing through layer 16. In this way, the prewarped image is effectively unwarped by passage through layer 16 and will not appear distorted on the output surface.

In configurations of the type shown in FIG. 1, device 10 may have four peripheral edges and a rectangular footprint when viewed in direction 26 or may have other suitable shapes (e.g., a circular outline when viewed in direction 26). To help minimize the size of inactive display borders as a user is viewing front face F of device 10 as shown in FIG. 1, the shapes of fibers 16F along the periphery of layer 16 may be deformed outwardly as shown in FIG. 1. These fibers 16F each have an outwardly bent segment that bends away from surface normal n of the center of layer 30 (e.g., away from an axis parallel to the Z axis of FIG. 1) and each have an inwardly bent segment that bends back towards surface normal n to help direct output light towards viewer 28. Configurations in which fibers 16F are substantially straight and have an outwardly splayed configuration along the periphery of device 10 may also be used. Some arrangements for fibers 16F may have only vertically extending fibers (e.g., fibers that run parallel to surface normal n).

The deformed shapes of fibers 16F in the illustrative configuration of FIG. 1 (e.g., the bends in fibers 16F along their lengths) may help distribute image light laterally outwards in the X-Y plane so that the effective size of display 14 is enlarged and the image produced by display 14 covers some or all of the sidewalls of housing 12 or other peripheral portions of device 10 when the image on front face F is being viewed by viewer 28. For example, the bent shapes of fibers 16F of FIG. 1 may help shift portion of the displayed image laterally outward in the X-Y plane along the edges and corners of device 10 to block the edges of device 10 (e.g., the periphery of housing 12) from view. This helps make the display of device 10 appear borderless to viewer 28. In some arrangements, the portions of fibers 16F at the outermost surface of layer 16 are oriented parallel or nearly parallel with viewing direction 26 and the Z axis of FIG. 1, which helps ensure that some or all of the light that has passed through layer 16 will travel in the Z direction and be viewable by viewer 28.

Figure 2:
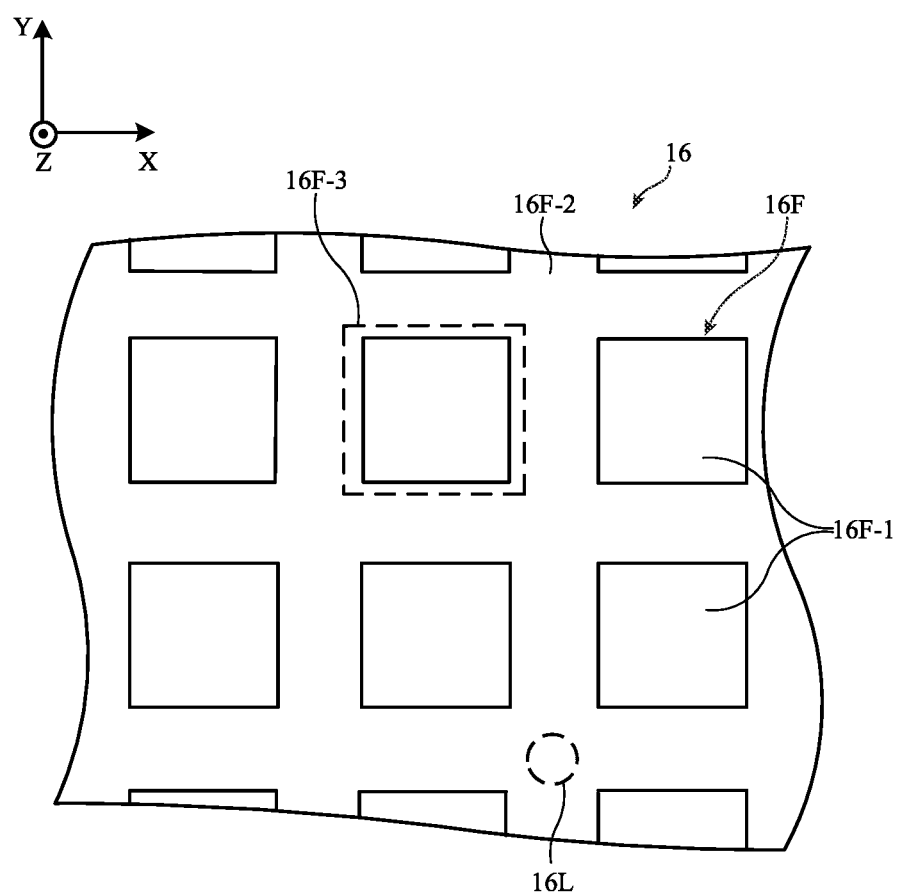
FIG. 2 is a cross-sectional view of a portion of an illustrative image transport layer formed using a coherent fiber bundle in accordance with an embodiment.

FIG. 2 is a cross-sectional view of a portion of an illustrative image transport layer. Fibers 16F in layer 16 form a coherent fiber bundle. As shown in the example of FIG. 2, fibers 16F may each have a fiber core such as core 16F-1. Cores 16F-1 and the other structures of image transport layer 16 (e.g., cladding structures, etc.) may be formed from materials such as polymer, glass, crystalline material such as sapphire, and/or other materials. Illustrative configurations in which image transport layer 16 is formed from glass are described herein as an example.

Fiber cores 16F-1 may be formed from transparent glass of a first refractive index and may be surrounded by glass cladding such as cladding 16F-2 of a second, lower refractive index to promote light guiding in accordance with the principal of total internal reflection. In some arrangements, a single coating layer on cores 16F-1 may be used to form the cladding. During processing, these coatings on fibers 16F-1 may merge. In other arrangements, two or more coating layers on cores 16F-1 may be provided (see, e.g., illustrative coating 16F-3). If desired, multiple coating layers (e.g., two coatings on each core 16F-1) may be used to form cladding. Clad fibers may optionally be held together using material that fills interstitial spaces between the clad fibers. In some configurations, stray light absorbing material such as illustrative stray light absorbing material 16L may be incorporated into layer 16 (e.g., into some of the cores, cladding, and/or other structures in layer 16). The stray light absorbing material may be, for example, light-absorbing glass formed from transparent glass into which light-absorbing material such as dye and/or pigment has been incorporated.

Fibers 16F may have any suitable cross-sectional shapes. For example, cores 16F-1 and coating(s) on cores 16F-1 may have circular cross-sectional shapes, may have rectangular cross-sectional shapes, may have square cross-sectional shapes, may be hexagonal, may be triangular, etc. In the illustrative example of FIG. 1, fiber cores 16F-1 are square.

In configurations in which fibers 16F have claddings formed from two or more separate cladding layers, the cladding layers may have the same index of refraction or the outermost layers may have lower refractive index values (as examples). Coating layers may have a refractive index equal to the refractive index of the cladding material, lower than the refractive index of the cladding material to promote total internal reflection, or higher than the refractive index of the cladding material (as examples).

In an illustrative configuration, each fiber core 16F-1 may have a first index of refraction and the cladding material surrounding that core (e.g., cladding 16F-2 of FIG. 2) may have a second index of refraction that is lower than the first index of refraction by an index difference of at least 0.05, at least 0.1, at least 0.15, at least 10%, at least 20%, less than 50%, less than 30%, or other suitable amount. The refractive index of optional additional materials incorporated into layer 16 (e.g., material that fills interstitial spaces between fibers 16F) may be the same as that of some or all of the cladding material coated onto cores 16F-1 or may be lower (or higher) than the lowest refractive index of that cladding material by an index difference of at least 0.05, at least 0.1, at least 0.15, at least 10%, at least 20%, less than 50%, less than 30%, or other suitable amount.

The lateral dimensions (e.g., diameters, widths, etc.) of cores 16F-1 may be, for example, at least 5 microns, at least 7 microns, at least 8 microns, at least 9 microns, less than 40 microns, less than 17 microns, less than 14 microns, less than 11 microns, or other suitable diameter. The thickness of cladding 16F-2 between respective cores 16F-1 may be at least 0.1 microns, at least 0.4 microns, less than 2.5 microns, less than 0.8 microns, etc. Fibers 16F (including cores and claddings) may have diameters of at least 6 microns, at least 7 microns, at least 8 microns, at least 9 microns, at least 30 microns, less than 50 microns, less than 17 microns, less than 14 microns, less than 11 microns, or other suitable diameter.

Fibers 16F may generally extend parallel to each other in image transport layer 16 (e.g., the fibers may run next to each other along the direction of light propagation through the fiber bundle). This allows image light or other light that is presented at the input surface to layer 16 to be conveyed to the output surface of layer 16.

Image transport layer 16 can be used to transport an image from a first (input) surface (e.g., the surface of a pixel array) to a second (output) surface (e.g., an outwardly facing surface in device 10 with compound curvature or other curved and/or planar surface shape) while preserving the integrity of the image.

Figure 3:
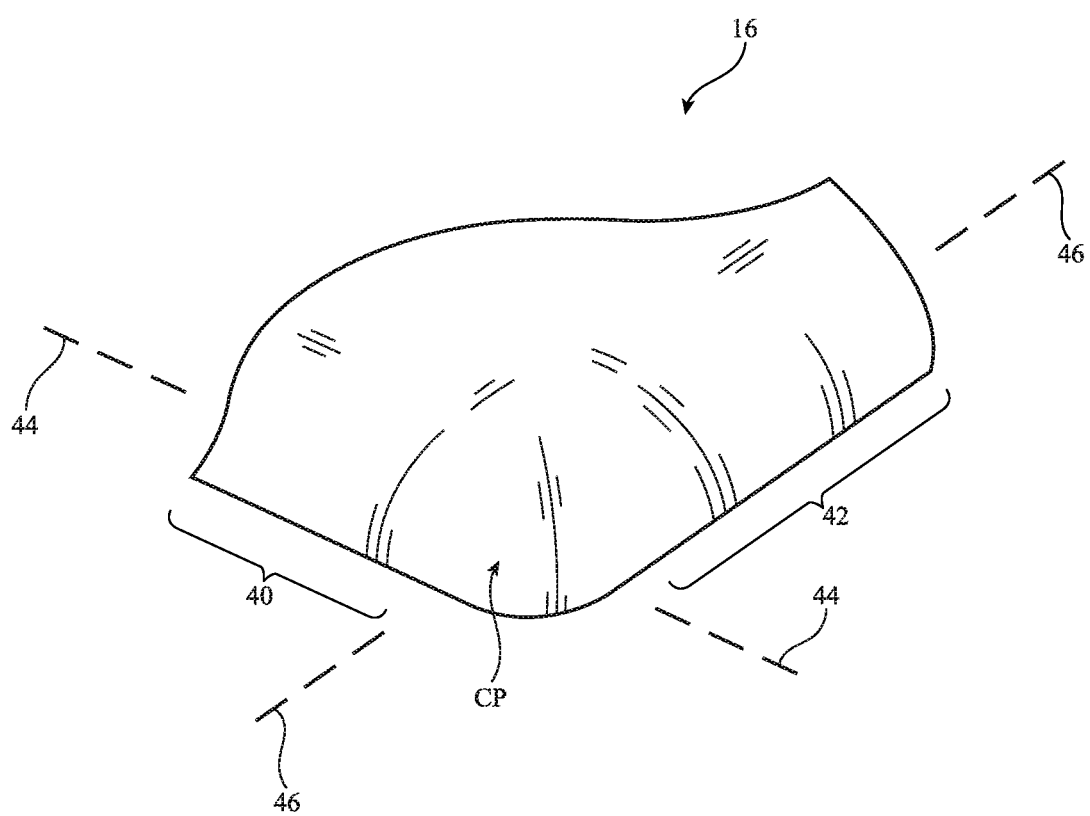
FIG. 3 is a perspective view of a portion of an image transport layer surface with compound curvature in accordance with an embodiment.

A perspective view of an illustrative corner portion of image transport layer 16 is shown in FIG. 3. In the example of FIG. 3, layer 16 has edge portions 40 and 42 with surfaces that curve about axes 44 and 46, respectively. These portions of layer 16 may extend parallel to the straight sides of device 10 (as an example) and are characterized by curved surfaces that can be flattened into a plane without distortion (sometimes referred to as developable surfaces). At the corner of image transport layer 16 of FIG. 3, image transport layer 16 has curved surface portions CP with compound curvature (e.g., a surface that can only be flattened into a plane with distortion, sometimes referred to as a surface with Gaussian curvature). In a rectangular layout with curved corners, image transport layer 16 may have four corners with compound curvature. Image transport layers of other shapes (e.g., circular outlines, etc.) may also have surfaces with compound curvature (e.g., dome-shaped surfaces, an edge surface of compound curvature that runs along the circular periphery of a central circular planar region, etc.). When selecting the size and shape of the output surface of layer 16 and therefore the size and shape of the image presented on the output surface, the use of an image transport layer material with compound curvature can provide design flexibility. In general, the outer surface of layer 16 may have planar areas and/or areas with curved cross-sectional profiles. The input surface of layer 16 may be planar and/or may have a curved cross-sectional profile.

Figure 4:
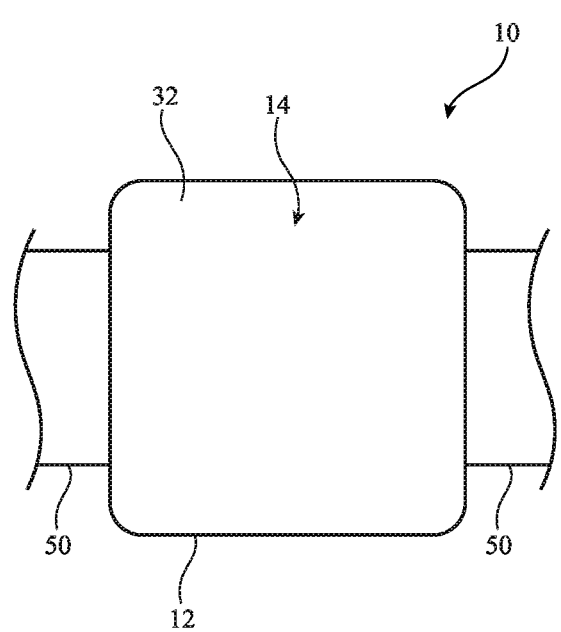
FIG. 4 is a top view of an illustrative electronic device in accordance with an embodiment.

In some arrangements, device 10 may include support structures such as wearable support structures. This allows device 10 to be worn on a body part of a user (e.g., the user's wrist, arm, head, leg, or other portion of the user's body). As an example, device 10 may include a wearable band, such as band 50 of FIG. 4. Band 50, which may sometimes be referred to as a wristband, wrist strap, or wristwatch band, may be formed from polymer, metal, fabric, leather or other natural materials, and/or other material, may have links, may stretch, may be attached to housing 12 in a fixed arrangement, may be detachably coupled to housing 12, may have a single segment or multiple segments joined by a clasp, and/or may have other features that facilitate the wearing of device 10 on a user's wrist.

Figure 5:
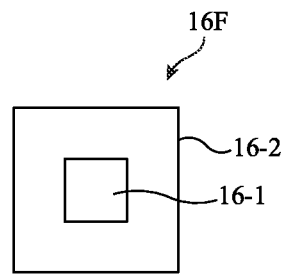
FIG. 5 is a cross-sectional view of an illustrative fiber in accordance with an embodiment.

Image transport layer material may be formed from glass fibers such as illustrative glass fiber 16F of FIG. 5. Fiber 16F may include fiber core 16-1 surrounded by cladding 16-2. Fibers such as fiber 16F may be drawn in a draw tower (e.g., fiber 16F be drawn from a preform in a heated environment in which the fiber 16F is stretched lengthwise and reduced in size laterally) or may be formed using extrusion equipment or other fiber-forming equipment. Fiber 16F of FIG. 5 has a square cross-sectional shape, but other shapes may be used for fiber 16F, if desired.

Figure 6:
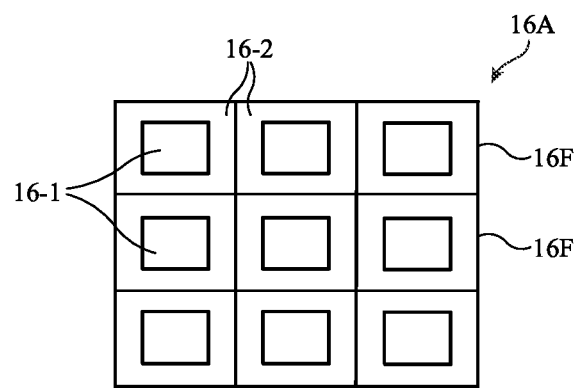
FIG. 6 is a cross-sectional view of an illustrative subblock of fused fibers in accordance with an embodiment.

After producing fiber 16F of a desired lateral size, multiple fibers 16F may be fused together in a heated die (e.g., heat and pressure may be used to fuse fibers 16F together). The fused fibers form a coherent fiber bundle. The fusion process may, as an example, be used to form a block of fibers 16F such as image transport layer subblock 16A of FIG. 6. If desired, the lateral dimensions of subblock 16A (and therefore the lateral dimensions of fibers 16F of subblock 16A) may be reduced by performing a draw operation on subblock 16A.

Figure 7:
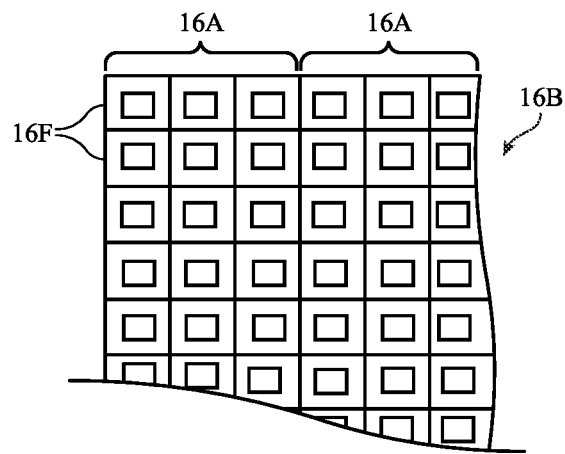
FIG. 7 is a cross-sectional view of an illustrative block image transport layer material formed from fused subblocks in accordance with an embodiment.

After reducing the lateral sizes of fibers 16F to desired values, multiple subblocks 16A may, if desired, be fused together to form a larger block of image transport layer material such as block 16B of FIG. 7. Block 16B may be formed into a desired shape (e.g., by optional molding operations in a heated die), may be machined into a desired shape, and/or may otherwise be shaped. Chemical strengthening may then be used to strengthen the image transport layer material. The chemically strengthened layer of image transport layer material (e.g., image transport layer 16 of FIG. 1) may be used in forming device 10.

Figure 8:
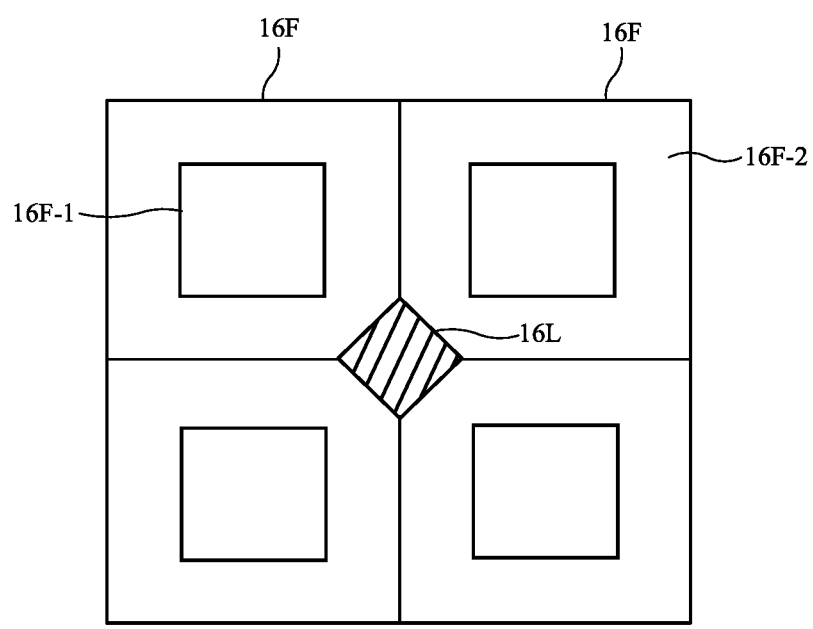
FIG. 8 is a cross-sectional view of illustrative image transport layer material that includes material for absorbing stray light in accordance with an embodiment.

If desired, the shapes of fibers 16F may be configured to facilitate incorporation of stray-light-absorbing material such as dark glass. For example, fibers 16F may have square shapes with beveled corners as shown in FIG. 8. When fibers 16F are joined together, the beveled corners may form spaces for stray-light-absorbing material 16L. Stray light that escapes fibers 16F within the coherent fiber bundle forming image transport layer 16 may be absorbed upon reaching material 16L, thereby helping to improve the quality of the image transported to the output surface of layer 16.

To help protect the exposed surface of device 10 from scratches and cracks, chemical strengthening operations may be performed on image transport layer material (e.g., block 16B of FIG. 7). As an example, image transport layer material may be chemically strengthened by performing an ion-exchange process on the image transport layer material. During the ion-exchange process, smaller ions in the glass may be replaced with larger ions. For example, sodium in the glass at the surface of the image transport layer may be replaced by potassium. This creates compressive stress on the treated surfaces of the image transport layer. The compressive stress may arise within fiber cores 16F-1, cladding 16F-2, and/or other portions of layer 16 (e.g., stray-light-absorber material, additional cladding layer(s), etc.).

Figure 9:
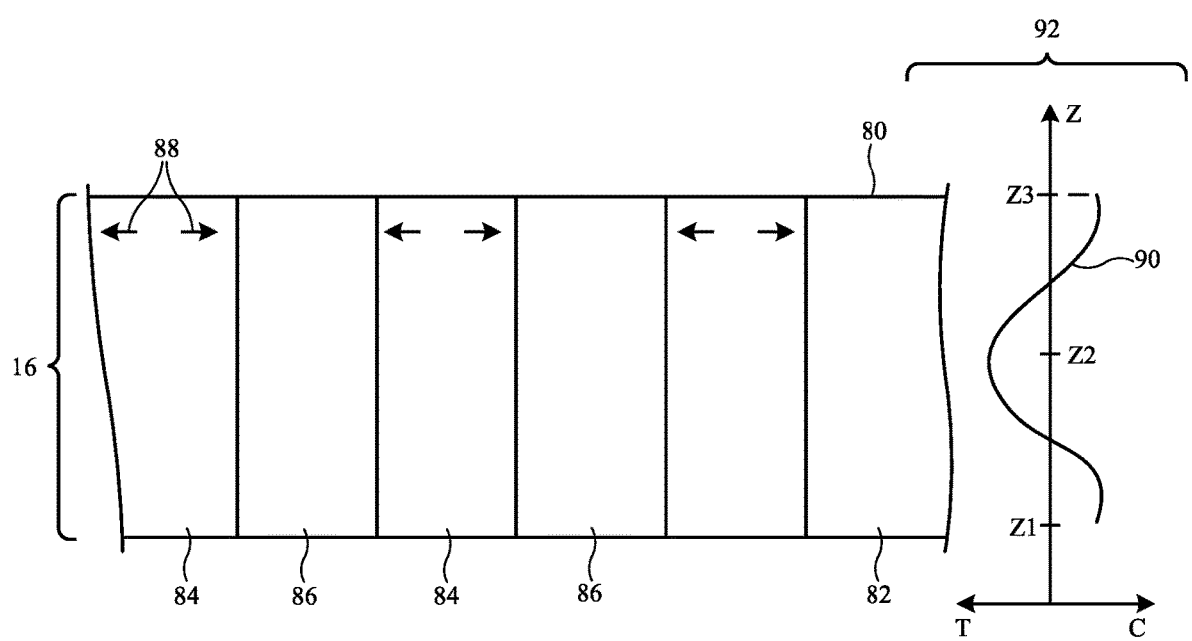
FIG. 9 is a cross-sectional side view of an illustrative image transport layer following chemical strengthening in accordance with an embodiment.

FIG. 9 is a cross-sectional side view of an illustrative chemically strengthened layer of image transport layer material. As shown in FIG. 9, image transport layer 16 may have an outwardly-facing upper surface 80 that is located at position Z3 along the Z axis and may have an opposing lower (inwardly-facing) surface 82 that is located at position Z1 along the Z axis. Layer 16 may have materials such as glass 84 and glass 86, with different compositions and different refractive indices. Glasses 84 and 86 may be used in forming fiber cores 16F-1 and cladding 16F-2, respectively. Glass may also be used in forming other structures in layer 16.

Following exposure of layer 16 to an ion-exchange bath to perform an ion-exchange process, one or more of the glass materials in layer 16 may be characterized by surfaces that are under compression laterally due to the presence of larger exchanged ions, as illustrated by arrows 88 in glass 84 in the example of FIG. 9. If, the compositions of glasses 84 and 86 only allow glass 84 to be ion exchanged, compressive stress from glass 84 may laterally transfer to adjacent glass 86. If only glass 86 is ion exchanged, compressive stress from glass 86 may laterally transfer to adjacent glass 84. In some illustrative arrangements, both glass 84 and glass 86 will be ion exchanged and the compressive stress from the surface portions of glass 84 and glass 86 will therefore place the surfaces of layer 16 under compression.

As shown in graph 92, in which curve 90 is used to represent stress level as a function of position in layer 16 along the Z axis, following the ion-exchange process, the surfaces of layer 16 may be in compression (C) near Z1 and Z3 and, in the center of layer 16, may be in tension (T) (e.g., at location Z2 with respect to the Z axis). The compressive stress produced at the surfaces of layer 16 may help protect layer 16 from damage from scratches, cracks, and associated breakage (e.g., layer 16 may be protected from breakage during an unintended drop event or other application of undesirably large amounts of stress).

Figure 10:
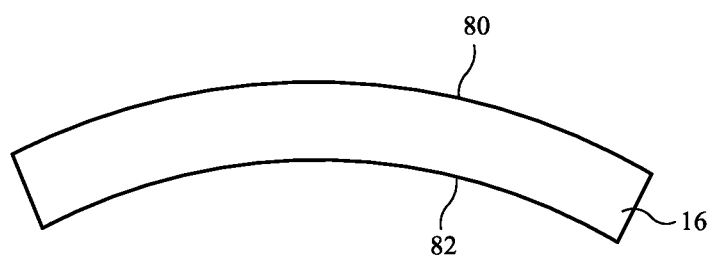
FIG. 10 is a cross-sectional side view of an illustrative image transport layer following chemical strengthen by different amounts on opposing surfaces in accordance with an embodiment.

Ion-exchange processes may be performed symmetrically on both upper surface 80 and lower surface 82 or may be performed on these surfaces asymmetrically. As shown in FIG. 10, surface 80 may be subjected to an ion exchange process that creates compressive stress at surface 80, whereas surface 82 may be subjected to a weaker ion exchange process or no ion exchange process, putting surface 82 under a reduced level of compressive stress (and potentially under tension). Due to the unequal amounts of compressive stress exhibited at surfaces 80 and 82 in this example, image transport layer 16 may assume a curved cross-sectional profile.

Figure 11:
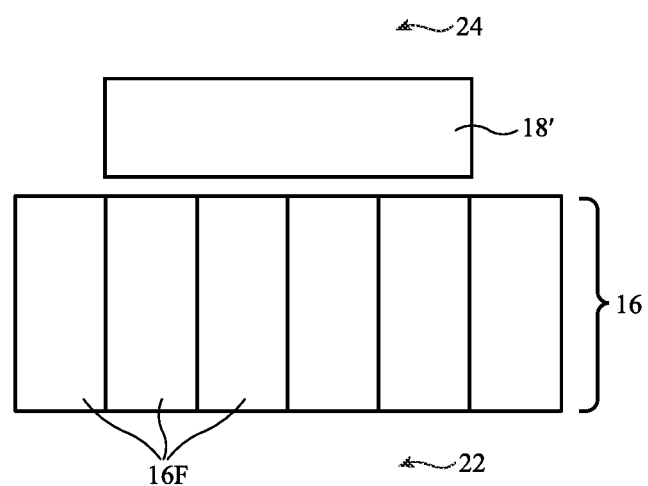
FIG. 11 is a cross-sectional side view of illustrative image transport layer material overlapping a sensor in accordance with an embodiment.

As described in connection with FIG. 1, components 18 may be mounted in interior region 24 of device 10. As shown in FIG. 11, a component in interior region 24 (e.g., component 18') may be overlapped by image transport layer 16. Image transport layer 16 may be used to convey emitted light from one or more light-emitting devices in component 18' (e.g., one or more light-emitting diodes or lasers operating at visible and/or infrared wavelengths) to exterior region 22 and/or may be used to convey light from exterior region 22 to one or more light detectors in component 18'.

Component 18' may be, for example, a heart-rate sensor (e.g., a photoplethysmography sensor), a blood oxygen sensor, or other optical sensor. Fibers 16F in image transport layer 16 of FIG. 11 may be larger or smaller than fibers 16F used in conveying image light from display 14 to the image transport layer output surface on the outer surface of device 10 of FIG. 1. Image transport layer 16 of FIG. 11 may form a wall of housing 12 (e.g., a rear housing wall on rear face R such as a rear housing wall that is configured to rest against a user's skin when device 10 is worn on a user's wrist, as described in connection with illustrative device 10 of FIG. 4).

Figure 12:
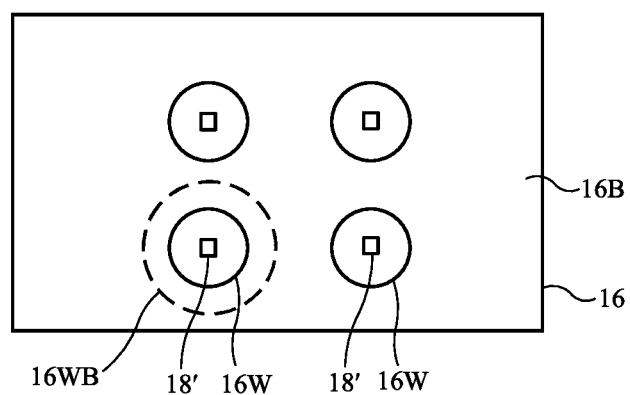
FIG. 12 is a rear view of an illustrative electronic device having a housing wall that includes image transport layer material with transparent windows within an opaque region in accordance with an embodiment.

FIG. 12 is a rear view of a portion of device 10 in an illustrative configuration in which rear face R or other portion of housing 12 has image transport layer material overlapping electrical components such as optical components. As shown in FIG. 12, image transport layer 16 may have window regions such as windows 16W formed within other areas such as area 16B. Windows 16W may be transparent to visible and/or infrared light to accommodate light transmission associated with the operation of optical components such as optical sensors 18' that are aligned with and overlapped by respective windows 16W (e.g., optical sensors 18' in interior region 24). Area 16B may have dark glass (e.g., fibers 16F that are formed from dark glass cores and/or dark glass cladding). Configurations in which the interior of layer 16 in area 16B is coated with opaque masking material such as a layer of black ink and/or other opaque masking layer(s) may also be used. If desired, window borders 16WB may have different optical properties than other portions of layer 16. As an example, borders 16WB may have more stray-light-absorbing material 16L than other portions of layer 16, may be opaque to help absorb stray light and/or to reduce cross-talk between adjacent windows 16W (e.g., by forming the cores and/or claddings of fibers 16F in the border regions from dark glass), and/or may have other optical properties.

Figure 13:
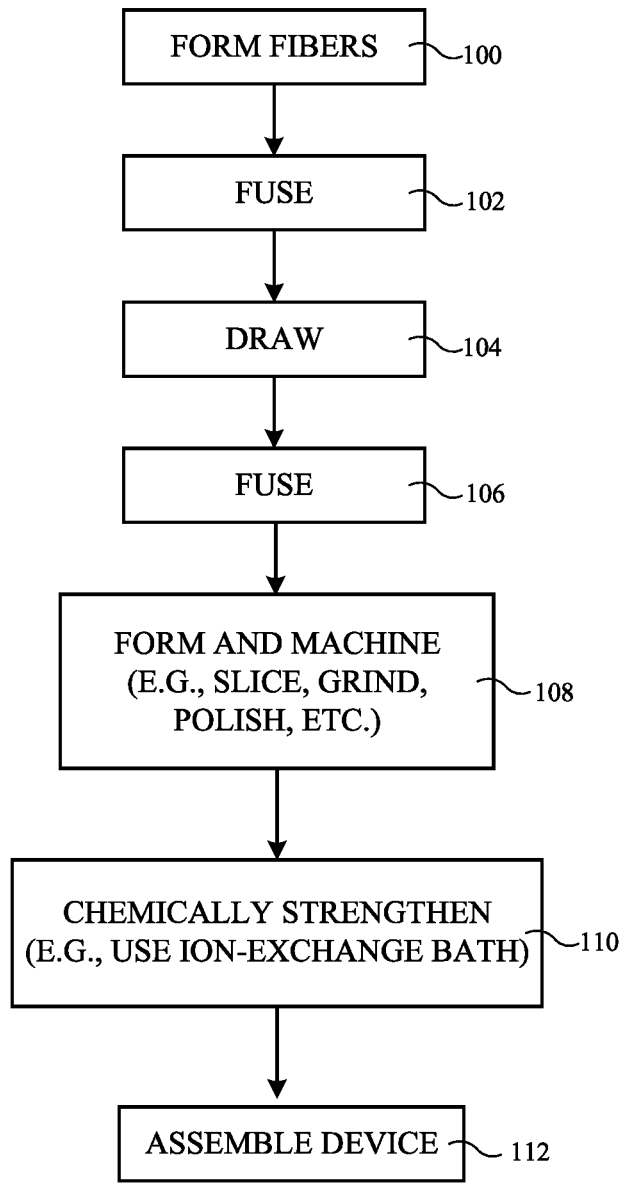
FIG. 13 is a flow chart of illustrative operations involved in forming an electronic device with chemically strengthened coherent fiber bundle material in accordance with an embodiment.

FIG. 13 is a flow chart of illustrative operations involved in forming a device such as device 10 with an image transport layer such as image transport layer 16.

During the operations of block 100, glass fibers such as fibers 16F of FIG. 5 may be formed. If desired, fibers 16F of FIG. 5 may have lateral dimensions that are larger than desired for image transport layer 16. Fibers 16F may have cores such as cores 16-1 and claddings such as cladding 16-2 that are formed from glass. Fibers 16F may be drawn from preforms and/or may be formed using other fiber forming techniques (e.g., extrusion). Fibers 16F may be formed individually or multi-core filaments that contain multiple fiber cores can be formed. If desired, an optional drawing operation may be performed on the fibers created during the operations of block 100 (e.g., to reduce the lateral dimensions of the fibers).

The fibers formed during the operations of block 100 may be fused to form blocks of fibers during the fusing operations of block 102. Fusion may be performed by applying sufficient heat and pressure with a heated die to fuse the fibers into a block of image transport layer material such as subblock 16A of FIG. 6.

If desired, an optional drawing operation may be performed on subblock 16A during block 104. This reduces the lateral dimensions of the subblock and reduces the lateral dimensions of the fibers 16F within the subblock. By performing one or more drawing operations in this way, fibers 16F with desired dimensions (e.g., relatively small dimensions) may be produced.

In scenarios in which it is desired to enlarge the overall size of the image transport layer material (e.g., to when the desired coverage area for layer 16 is larger than subblock 16A), multiple subblocks 16A may, during the fusing operations of block 106, be fused together laterally to form a larger block of image transport layer material (see, e.g., a block such as block 16B of FIG. 17).

During the operations of block 108, the image transport layer material of block 16B may be shaped. For example, block 16B may be molded in a heated die (e.g., to form block 16B into a desired shape, to create bends in fibers 16F such as the bends shown at the periphery of layer 16 of FIG. 1), and/or to otherwise change the shape of block 16B. Following this optional forming operation, block 16B may be sliced to produce multiples slides of image transport layer material (e.g., a saw may be used to cut block 16B into a series of planar fiber optic plates). In addition to or instead of slicing layers of block 16B, the material of block 16B may be machined. For example, grinding operations may be used to provide the edges of the image transport layer material slices with curved cross-sectional profiles, areas of compound curvature, planar and/or curved inner surfaces, etc. Polishing operations may be performed to provide the image transport layer material with smooth surfaces.

Following the shaping operations of block 108, image transport layer 16 can be chemically strengthened. In particular, an ion-exchange process may be applied to the image transport layer material during the operations of block 110. The ion-exchange process exchanges smaller ions for larger ions at the surfaces of the image transport layer and thereby creates compressive stress in these surfaces.

Any suitable glass materials may be used in forming image transport layer material (e.g., cores 16-1, cladding 16-2, other portions of fibers 16F, stray-light absorbing material 16L, etc.). These glasses may include, for example, soda lime glass, borosilicate glass, alumino-silicate glass, lithium alumino-silicate glass, or glasses with other ion-exchangeable compositions. Additives such as aluminum oxide and alkaline oxides such as MgO, CaO, PbO, and $B_2O_3$ may be included to help increase the refractive index of the glass (e.g., when forming higher-index structures such as cores 16F-1). By selecting the compositions of the glasses used in forming different structures in layer 16, each of these structures can be provided with a desired refractive index value (e.g., to produce core-to-cladding refractive index differences that are suitable for light guiding, etc.). Some or all of the portions of layer 16 may be formed from ion-exchangeable glass. For example, only cores 16-1 may be ion-exchangeable, only cladding 16-2 may be ion-exchangeable, only stray-light-absorbing material 16L may be ion-exchangeable, both cladding and core materials may be ion-exchangeable, all materials forming layer 16 may be ion exchangeable, etc. In an illustrative configuration, at least cores 16-1 are ion-exchangeable and these cores occupy a substantial fraction of the surface area of layer 16.

The ion-exchangeable glasses used in forming layer 16 preferably include one or more ion-exchangeable ions such as Na+, K+, or Li+. When exposed to an ion-exchange bath, these ions may be exchanged with different ions such as K+, Na+, Li+, Cs+, Ag+, Tl+, Rb+ or similar ions in the bath. For example, during exposure to an ion-exchange bath such as a potassium salt bath, ions from the bath (e.g., K+ ions in this example) may be exchanged with ions in the ion-exchangeable glass. (e.g., Na+, as an illustrative example). This places the treated surface of the glass in compression, as described in connection with FIG. 9. The bath may be applied symmetrically to the upper and lower surfaces of the image transport layer or may be applied asymmetrically (e.g., only to the upper surface and not the lower surface or more on the upper surface and less on the lower surface).

Following the fabrication of the image transport layer from desired glass materials (e.g., ion-exchangeable materials), the shaping of the image transport layer, and the chemical strengthening of the image transport layer, the image transport layer, the image transport layer may, during the operations of block 112, be assembled into device 10. For example, display 14, layer(s) 16, components such as component 18', and associated support structures and internal components may be coupled to device 10 (e.g., housing 12) using adhesive, fasteners (e.g., screws), welds, press-fit joints, flexible engagement structures (e.g., springs, clips, etc.), and/or other mounting structures.

Image transport layer 16 may be mounted within housing 12 to form some or all of front face F (e.g., overlapping display 14), some or all of sidewall structures in device 10, and/or some or all of rear housing wall on rear face R (e.g., overlapping one or more optical components such as optical sensor 18' of FIG. 11). In an illustrative configuration, when layer 16 is used to cover display 14 on front face F, layer 16 is the only structural glass layer covering display 14. As a result, layer 16 serves as the display cover layer for display 14 (e.g. layer 16 forms a display cover glass layer that is used as the outermost protective layer in device 10 without additional structural polymer or glass layers to cover and protect display 14). Optional oleophobic thin-film coatings (e.g., fluoropolymer coatings and/or other thin-film coatings) may, if desired, be applied to a chemically strengthened coherent fiber bundle such as layer 16 that is serving as a display cover glass. By using chemically strengthened glass in forming image transport layer 16 (the coherent fiber bundle formed from fibers 16F), the resistance of layer 16 to scratches and cracks may be enhanced. This may help make device 10 resistant to damage in the event that device 10 is dropped or otherwise exposed to excessive stress.

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to control the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
a display configured to produce an image; and
a chemically strengthened glass coherent fiber bundle overlapping the display, wherein the chemically strengthened glass coherent fiber bundle has an output surface with compound curvature.

2. The electronic device defined in claim 1 wherein the chemically strengthened glass coherent fiber bundle comprises glass fiber cores having glass cladding and wherein the glass fiber cores comprise surface portions that include ion-exchanged glass.

3. The electronic device defined in claim 1 wherein the chemically strengthened glass coherent fiber bundle comprises glass fiber cores having glass cladding and wherein the glass cladding comprises a surface portion that includes ion-exchanged glass.

4. The electronic device defined in claim 1 wherein the chemically strengthened glass coherent fiber bundle comprises glass fiber cores having glass cladding, wherein the glass fiber cores comprise surface portions that include a first ion-exchanged glass of a first composition, and wherein the glass cladding comprises a surface portion that includes a second ion-exchanged glass of a second composition that is different than the first composition.

5. The electronic device defined in claim 1 wherein the output surface has a curved cross-sectional profile.

6. The electronic device defined in claim 1 wherein the chemically strengthened glass coherent fiber bundle comprises glass selected from the group consisting of: soda lime glass, borosilicate glass, alumino-silicate glass, and lithium alumino-silicate glass.

7. The electronic device defined in claim 1 wherein the chemically strengthened glass coherent fiber bundle comprises an edge portion having fibers with bends.

8. The electronic device defined in claim 1 further comprising:
an optical sensor; and
a housing wall formed from an additional chemically strengthened glass coherent fiber bundle that overlaps the optical sensor.

9. The electronic device defined in claim 8 wherein the additional chemically strengthened glass coherent fiber bundle has a transparent sensor window aligned with the optical sensor and has an opaque area surrounding the transparent sensor window.

10. The electronic device defined in claim 1 wherein the chemically strengthened glass coherent fiber bundle comprises inner and outer surfaces and wherein the outer surface is under more compressive stress from chemical strengthening than the inner surface.

11. An electronic device, comprising:
a housing;
an optical sensor in the housing; and
a chemically strengthened glass coherent fiber bundle that overlaps the optical sensor.

12. The electronic device defined in claim 11 wherein the chemically strengthened glass coherent fiber bundle has an inner surface facing the optical sensor and an opposing outer surface facing away from the optical sensor and wherein at least the outer surface is an ion-exchanged surface under compressive stress.

13. The electronic device defined in a claim 12 wherein the inner surface is an ion-exchanged surface under compressive stress.

14. The electronic device defined in claim 12 wherein the outer surface is under more compressive stress than the inner surface and wherein the outer surface has a curved cross-sectional profile.

15. The electronic device defined in claim 12 wherein the inner and outer surfaces have equal amounts of compressive stress.

16. The electronic device defined in claim 11 wherein the electronic device has opposing front and rear faces and wherein the chemically strengthened glass coherent fiber bundle is on the rear face.

17. The electronic device defined in claim 16 further comprising a wristband coupled to the housing, wherein the optical sensor comprises a heart rate sensor.

18. A chemically strengthened glass coherent fiber bundle having opposing first and second surfaces, comprising:
glass fiber cores each extending from the first surface to the second surface, wherein the glass fiber cores at the first surface comprise ion-exchanged glass under compressive stress; and
glass fiber cladding on the cores.

19. The chemically strengthened glass coherent fiber bundle defined in claim 18 wherein the glass fiber cladding at the first surface comprises ion-exchanged glass under compressive stress and wherein the ion-exchanged glass of the glass fiber cores and the ion-exchanged glass of the glass fiber cladding have different compositions.

20. An electronic device, comprising:
a display configured to produce an image; and
a chemically strengthened glass coherent fiber bundle overlapping the display, wherein the chemically strengthened glass coherent fiber bundle comprises inner and outer surfaces and wherein the outer surface is under more compressive stress from chemical strengthening than the inner surface.

* * * * *